US009484181B2

United States Patent
Dohi et al.

(10) Patent No.: US 9,484,181 B2
(45) Date of Patent: Nov. 1, 2016

(54) CHARGED PARTICLE BEAM APPARATUS AND TRAJECTORY CORRECTION METHOD IN CHARGED PARTICLE BEAM APPARATUS

(71) Applicant: Hitachi High-Technologies Corporation, Minato-ku, Tokyo (JP)

(72) Inventors: Hideto Dohi, Tokyo (JP); Akira Ikegami, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/760,053

(22) PCT Filed: Jan. 21, 2014

(86) PCT No.: PCT/JP2014/051070
§ 371 (c)(1),
(2) Date: Jul. 9, 2015

(87) PCT Pub. No.: WO2014/115708
PCT Pub. Date: Jul. 31, 2014

(65) Prior Publication Data
US 2015/0357155 A1   Dec. 10, 2015

(30) Foreign Application Priority Data
Jan. 24, 2013   (JP) ................................ 2013-011241

(51) Int. Cl.
*H01J 37/147* (2006.01)
*H01J 37/153* (2006.01)
(Continued)

(52) U.S. Cl.
CPC .......... *H01J 37/1478* (2013.01); *H01J 37/147* (2013.01); *H01J 37/153* (2013.01);
(Continued)

(58) Field of Classification Search
CPC .. H01J 37/1478; H01J 37/147; H01J 37/153; H01J 37/28; H01J 37/22; H01J 37/222; H01J 2237/1506; H01J 2237/1507; H01J 2237/221; H01J 2237/2806
See application file for complete search history.

(56) References Cited

U.S. PATENT DOCUMENTS 4,983,832 A   1/1991 Sato
5,838,011 A * 11/1998 Krijn ..................... H01J 37/153
                                            250/396 R
(Continued)

FOREIGN PATENT DOCUMENTS

JP      2-33843 A     2/1990
JP    2001-15055 A    1/2001
(Continued)

OTHER PUBLICATIONS

International Search Report (PCT/ISA/210) dated Feb. 18, 2014 with English-language translation (two (2) pages).

*Primary Examiner* — Jack Berman
(74) *Attorney, Agent, or Firm* — Crowell & Moring LLP

(57) ABSTRACT

There is provided a charged particle beam apparatus that includes a trajectory monitoring unit which is disposed above an objective lens (14) and which includes an optical element (12) having a lens action and a trajectory correcting deflector (10). An applied voltage and an excitation current of the optical element (12) are set to zero after a trajectory correction of a primary charged particle beam (30). Accordingly, the lens action and an aberration of the optical element (12) have no influence on resolution.

13 Claims, 9 Drawing Sheets

(51) Int. Cl.
    *H01J 37/28* (2006.01)
    *H01J 37/22* (2006.01)
(52) U.S. Cl.
    CPC ............... *H01J 37/28* (2013.01); *H01J 37/22* (2013.01); *H01J 37/222* (2013.01); *H01J 2237/1506* (2013.01); *H01J 2237/1507* (2013.01); *H01J 2237/221* (2013.01); *H01J 2237/2806* (2013.01)

(56) References Cited

U.S. PATENT DOCUMENTS

| | | |
|---|---|---|
| 6,614,026 B1 | 9/2003 | Adamec |
| 6,627,890 B2 * | 9/2003 | Lanio .................... H01J 37/153 250/306 |
| 7,705,300 B2 * | 4/2010 | Morokuma ........... H01J 37/153 250/310 |
| 2002/0179851 A1 | 12/2002 | Sato et al. |
| 2005/0285036 A1 | 12/2005 | Sato et al. |
| 2006/0033037 A1 | 2/2006 | Kawasaki et al. |

FOREIGN PATENT DOCUMENTS

| | | |
|---|---|---|
| JP | 2002-352758 A | 12/2002 |
| JP | 2006-12664 A | 1/2006 |
| JP | 2006-54074 A | 2/2006 |

\* cited by examiner

CHARGED PARTICLE BEAM APPARATUS AND TRAJECTORY CORRECTION METHOD IN CHARGED PARTICLE BEAM APPARATUS

TECHNICAL FIELD

The present invention relates to a charged particle beam apparatus and a trajectory correction method in the charged particle beam apparatus.

BACKGROUND ART

A charged particle beam apparatus represented by a scanning electron microscope (SEM) detects charged particles (secondary electrons or the like) obtained by scanning a sample with a charged particle beam such as an electron beam and forms an image. Particularly, in an SEM that measures and inspects a semiconductor, electrons generated from a sample through electron beam irradiation are detected and thereby, the shape or composition of the sample is measured or a defect in an LSI is inspected.

In order to improve the yield ratio of a three-dimensional device, three-dimensional observation is required as an important function in an inspection instrument and a measuring instrument which use electron beams. The three-dimensional observation in the SEM is performed using a method in which a stage is tilted and an image is obtained. However, the tilt of the sample stage or column requires a mechanical operation and thus, there is a problem in that reproducibility of a throughput or a tilted angle deteriorates.

In order to perform the three-dimensional observation without a mechanical tilt, a method in which a deflector is used to tilt a beam is considered. However, when the deflector is used to tilt (deflect) the beam, an off-axis aberration of a lens occurs, the beam is increased in diameter, and resolution deteriorates particularly due to an off-axis chromatic aberration and a deflected coma aberration. In order to correct the off-axis aberrations which occur during the beam tilt, aberrations having reverse signs, which are equal to the aberrations occurring in an objective lens need to be generated in a separate optical element and thus, the following method is known.

PTL 1 discloses an adjustment method in which an optical condition is set to achieve a positional shift of zero on an image when an applied voltage and an excitation current to respective lenses are changed and thereby an off-axis chromatic aberration of an objective lens is corrected.

PTL 2 discloses a scanning-type electron microscope which is aimed at achieving stereoscopic observation without a positional shift on the sample even when a beam is tilted. PTL 2 shows an effectivity of forming a support point of deflection of a central trajectory (deflected trajectory) which is curved by a deflector at the same position of an object plane of a lens.

PTL 3 discloses a method in which electromagnetic multipoles are used to generate chromatic dispersion and thereby, an off-axis chromatic aberration which occurs during a beam tilt is corrected. Further, PTL 4 discloses a method in which a beam is tilted without moving an object point of an aberration corrector disposed to be closer to an electron source than an objective lens and thereby, a chromatic aberration and a spherical aberration which occur during a beam tilt are corrected by the aberration corrector.

CITATION LIST

Patent Literature

PTL 1: JP-A-2006-12664
PTL 2: JP-A-02-33843
PTL 3: JP-A-2001-15055
PTL 4: JP-A-2006-54074
PTL 5: JP-A-2002-352758

SUMMARY OF INVENTION

Technical Problem

In PTL 1, an off-axis chromatic aberration generated when a beam is tilted with respect to a sample using a lens action off the axis of an objective lens is corrected by an equal amount of an off-axis chromatic aberration having a reverse sign, which is generated by the beam passing off-axis through an aberration correcting lens disposed on the objective lens and thereby, resolution deterioration due to the beam tilt is suppressed. However, in order to acquire a beam tilt image with high resolution at a large angle exceeding 10 degrees, both the off-axis chromatic aberration and a deflected coma aberration need to be corrected at the same time.

In order to generate a deflected coma aberration with which the deflected coma aberration of the objective lens can be corrected, an aberration correcting lens having a great spherical aberration is required. When a beam passes off-axis through the aberration correcting lens, a deflected coma aberration is generated. However, the trajectory of the beam is changed from a paraxial trajectory due to the spherical aberration and an incident angle and a passing position through the objective lens are changed. The change occurs in a non-linear manner with respect to a tilt angle and thus, an aberration amount generated at the objective lens is changed in a non-linear manner. Accordingly, in order to control the aberration amount for each tilt angle, the incident angle and the passing position through the objective lens need to be controlled and thus, a passing position and an incident angle of the beam trajectory need to be controlled. Although a beam tilt at a great angle exceeding 10 degrees has been described above, a monitoring function of a beam trajectory is useful to improve reproducibility of the tilt angle and the resolution even in a beam tilt at an angle smaller than 10 degrees.

In order to also realize reduction of positional shift during the beam tilt, which is disclosed in PTL 2, trajectory correcting means for realizing a tilted trajectory on which an object point of the objective lens becomes a support point of deflection is required.

The present invention provides a monitoring function of a trajectory of a beam incident to a lens and a correction technique of the beam trajectory.

Solution to Problem

In order to solve the problem described above, a configuration in claims is adapted. The present application includes a plurality of means for solving the problems. According to an example, there is provided a charged particle beam apparatus including: a charged particle source for supplying a primary charged particle beam; a condenser lens for controlling a focusing angle and a focusing position of the primary charged particle beam; an objective lens for focusing the primary charged particle beam on a sample; a scanning device that scans the sample with the primary charged particle beam; a detector that detects charged particles which are generated from the sample; an image processing device that forms a sample image based on a signal from the detector; and a trajectory monitoring unit that is disposed above the objective lens and includes an optical element having a lens action and a trajectory correcting deflector, in which an applied voltage and an excitation current of the optical element are set to zero after a trajectory correction of the primary charged particle beam.

According to another example, there is provided a trajectory correction method of a charged particle beam apparatus that includes a charged particle source for supplying a primary charged particle beam, a condenser lens for controlling a focusing angle and a focusing position of the primary charged particle beam, an objective lens for focusing the primary charged particle beam on a sample, a scanning device that scans the sample with the primary charged particle beam, a detector that detects charged particles which are generated from the sample, an image processing device that forms a sample image based on a signal from the detector, and a trajectory monitoring unit that is disposed above the objective lens and includes an optical element having a lens action and a trajectory correcting deflector. The trajectory correction method of a charged particle beam apparatus includes: adjusting an applied voltage and an excitation current of the trajectory correcting deflector such that an image shift amount of the sample image becomes zero in a first control mode in which each of the applied voltage and the excitation current of the optical element is caused to temporally change; setting the applied voltage and the excitation current of the optical element to zero; and adjusting an applied voltage and an excitation current of the trajectory correcting deflector such that an image shift amount of the sample image becomes zero in a second control mode in which an excitation current of the objective lens is caused to temporally change.

Advantageous Effects of Invention

According to the present invention, a trajectory of a beam incident to a lens is monitored and it is possible to correct the beam trajectory.

Other characteristic aspects of the present invention will be clearly provided in the description of the present specification and the accompanying drawings. Other objects, configurations, and effects which are not described above will be clearly described in the following examples.

DESCRIPTION OF EMBODIMENTS

Hereinafter, examples of the present invention will be described with reference to the accompanying drawings. The accompanying drawings show specific examples in accordance with a principle of the present invention; however, the accompanying drawings are provided for understanding of the present invention and are not to be used for construing the present invention to be limited thereto.

A charged particle beam apparatus accelerates particles (charged particles) having a charge such as an electron or a positive ion using an electric field and irradiates a sample with a charged particle beam. The charged particle beam apparatus uses interaction between the sample and the charged particles and performs observation, analysis, processing operation, or the like of the sample. Examples of the charged particle beam apparatus include an electronic microscope, an electron beam lithography system, an ion processing apparatus, an ion microscope, or the like. The present invention can be applied to these charged particle beam apparatuses.

Example 1

Figure 1:
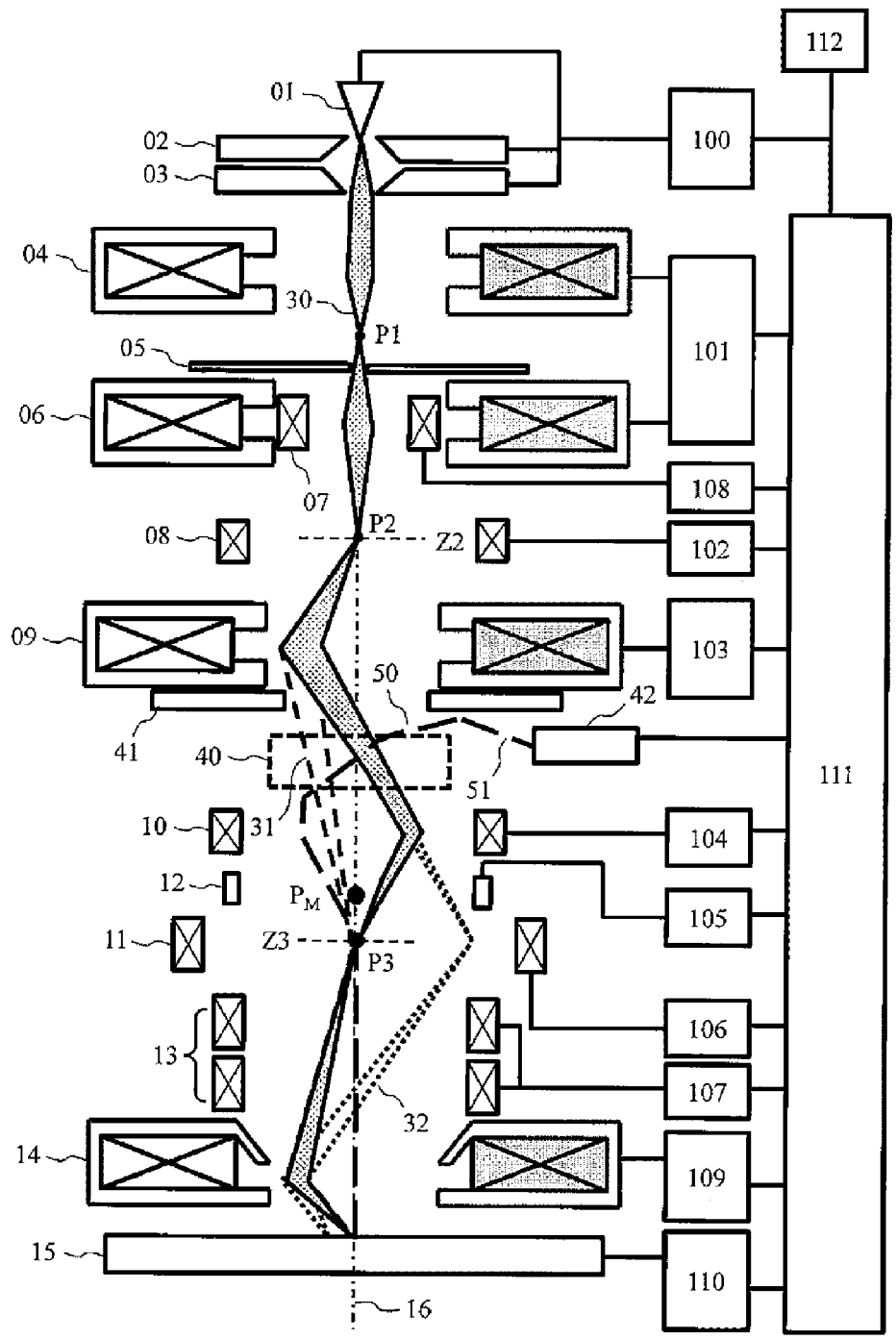
FIG. 1 is a schematic diagram of a configuration of an optical system of a charged particle beam apparatus according to Example 1.

FIG. 1 is a schematic diagram of a configuration of an optical system of a charged particle beam apparatus according to Example 1. First, an operation performed when the primary electron is incident perpendicular to the sample is described.

A voltage is applied between a cathode 01 and a first anode 02 by a high-voltage control unit 100 and a primary electron (primary charged particle beam) 30 is released at a predetermined emission current. In addition, an acceleration voltage is applied between the cathode 01 and a second anode 03 by the high-voltage control unit 100 and the primary electron 30 is accelerated and is incident to a lens on a subsequent stage.

The charged particle beam apparatus includes a plurality of condenser lenses 04 and 06 for controlling a focusing angle and a focusing position of the primary electron 30. The primary electron 30 is converged at a point P1 on an optical axis 16 by the condenser lens 04 which is controlled by a condenser lens control unit 101, then, the primary electron 30 passes through an objective aperture 05, and an unnecessary electron is removed. Then, the primary electron 30 is converged at a point P2 on the optical axis 16 by the condenser lens 06 which is controlled by the condenser lens control unit 101.

Next, the primary electron 30 is incident to an aberration correcting lens 09 which is controlled by an aberration correcting lens control unit 103 and is converged at a point P3 on the optical axis 16. At this time, the primary electron 30 is incident to an objective lens 14 which is controlled by an objective lens control unit 109, is converged on a sample 15, and forms a tiny spot.

A scanning deflector 13 which is controlled by a scanning deflector control unit 107 causes the sample 15 to be scanned in a planar manner with the primary electron 30. A secondary electron 50 which is generated from the sample 15 by the primary electron 30 travels above the objective lens 14, then, is separated from the primary electron 30 by a crossed electric and magnetic field generating device (EXB) 40 for secondary electron separation, and is incident to a reflector 41. A tertiary electron 51 is generated from the secondary electron 50 on the reflector 41. The tertiary electron 51 is detected by a detector 42. A signal detected by the detector 42 is transmitted to an image processing apparatus (not shown) and the image processing apparatus forms a sample image corresponding to an irradiation region of the primary electron 30 based on the signal detected by the detector 42. The formed sample image is displayed on an image display unit 112 through an optical system control unit 111. A position of the sample 15 may be controlled by controlling a sample stage (not shown) which is controlled by a stage control unit 110.

Figure 2:
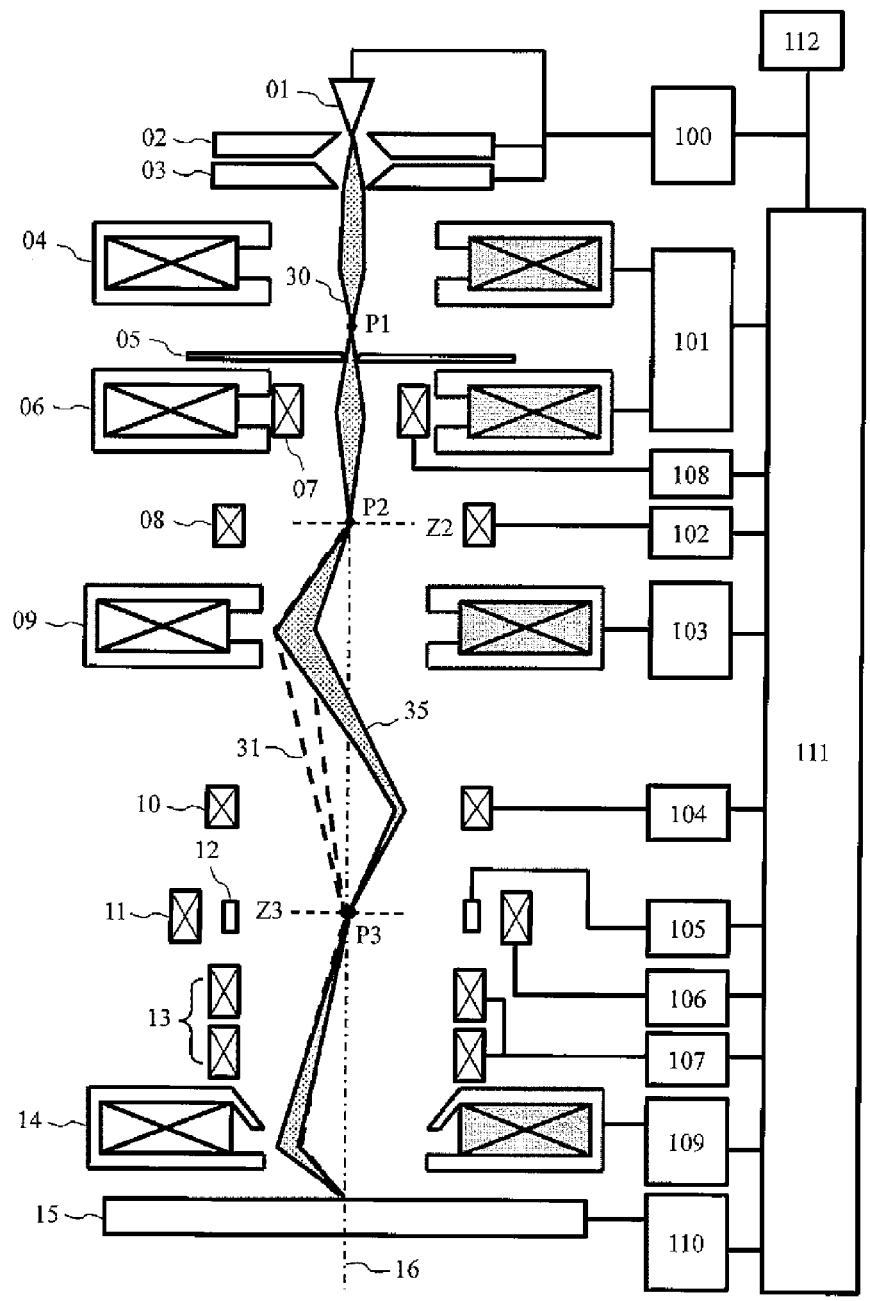
FIG. 2 is a schematic diagram of a configuration of an optical system of a charged particle beam apparatus according to Example 2.
Figure 9:
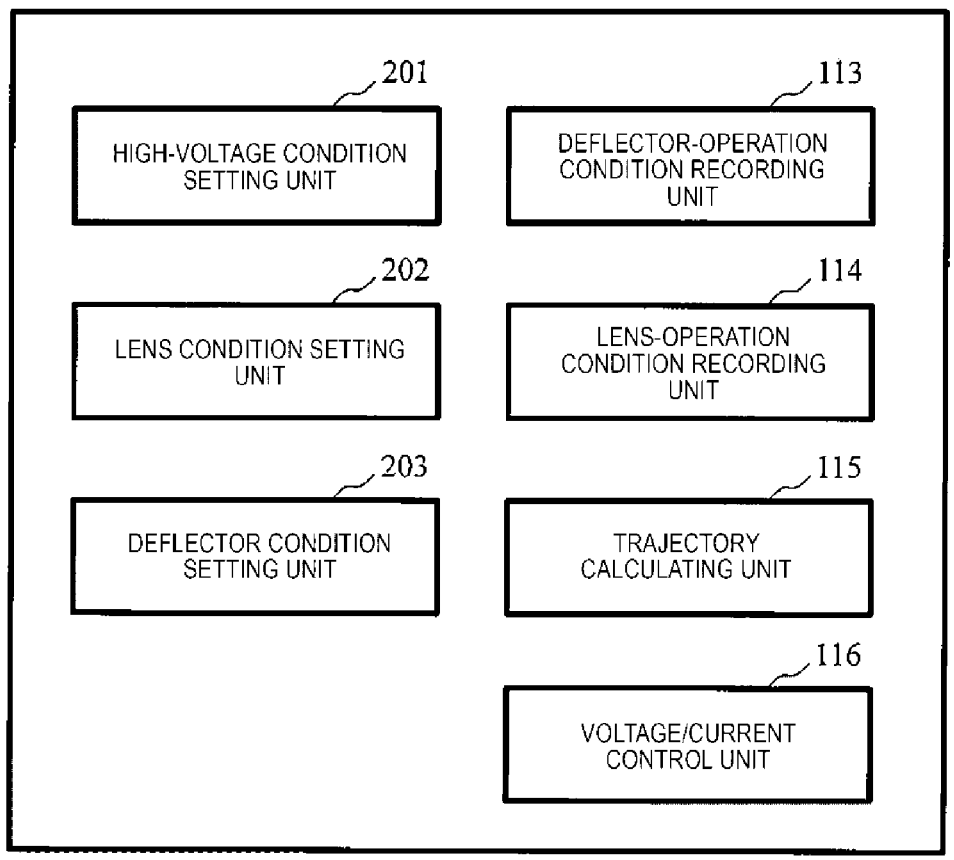
FIG. 9 is a diagram showing a configuration of an optical system control unit.

FIG. 9 is a diagram showing a configuration of the optical system control unit 111. The optical system control unit 111 means an information processing apparatus such as a workstation or a personal computer. The optical system control unit 111 includes a central processor, an auxiliary storage device, a main memory, and an input/output device. For example, the central processor is configured of a processor (or also referred to as an operation unit) such as a central processing unit (CPU). For example, the auxiliary storage device means a hard disk, the main memory means a memory, and the input/output device means a keyboard and a pointing device (such as a mouse) or a display (image display unit 112). In FIG. 2, for the sake of simplicity, illustration of these components is omitted.

The optical system control unit 111 includes a high-voltage condition setting unit 201, a lens condition setting unit 202, a deflector condition setting unit 203, a deflector-operation condition recording unit 113, a lens-operation condition recording unit 114, a trajectory calculating unit 115, and a voltage/current control unit 116. Here, the respective setting units 201, 202, and 203, the trajectory calculating unit 115, and the voltage/current control unit 116 may be realized by a function of a program which is executed on a computer. That is, processes which are executed by these components may be stored in the memory as a program code and may be realized when the CPU executes the program code. In addition, these components may be realized by hardware, as in a designed integrated circuit, or the like. The deflector-operation condition recording unit 113 and the lens-operation condition recording unit 114 are realized by the storage device described above.

High voltages applied to the cathode 01, the first anode 02, and the second anode 03, and applied voltages and excitation currents of the respective lenses and the respective deflectors are set by the high-voltage condition setting unit 201, the lens condition setting unit 202, and the deflector condition setting unit 203, respectively. Operations of the respective control units 100 to 109 are controlled in accordance with conditions set by the high-voltage condition setting unit 201, the lens condition setting unit 202, and the deflector condition setting unit 203.

Next, an operation of an optical element, which is performed when an off-axis chromatic aberration is corrected using a method disclosed in PTL 1 will be described.

An aberration controlling deflector 08 which is controlled by the deflector control unit 102 is disposed such that the center thereof is positioned at the point P2. In addition, a tilting deflector 11 which is controlled by the deflector control unit 106 is disposed such that the center thereof is positioned at the point P3. At this time, as the aberration correcting lens 09, a lens which generates a significant chromatic aberration but has a sufficiently small spherical aberration.

The primary electron is deflected by the aberration controlling deflector 08 and passes off-axis through the aberration correcting lens 09. Further, the primary electron is deflected by the tilting deflector 11 in a reverse direction, thereby, passes off-axis through the objective lens 14, and is tilted and performs irradiation of the sample 15. The primary electron travels through a trajectory 31 (a trajectory below the point P3 is the same trajectory as that of the primary electron 30). The trajectory 31 is coincident with a paraxial trajectory.

In a case where a lens having a sufficiently great spherical aberration in addition to the chromatic aberration is used as the aberration correcting lens 09 in order to correct a deflected coma aberration in addition to the off-axis chromatic aberration, the primary electron travels through a trajectory 32. In the case of the trajectory 32, the primary electron passes through a position significantly separated from the point P3 on an object plane Z3 of the objective lens 14. Hereinafter, a configuration of a trajectory monitoring unit for monitoring the change from the trajectory 31 to the trajectory 32 and a correction method of a trajectory using the configuration will be described.

The charged particle beam apparatus of the present example includes a trajectory correcting deflector 10, the tilting deflector 11, and a trajectory monitoring lens (optical element having a lens action) 12 as a trajectory monitoring unit. As above, the tilting deflector 11 is disposed such that the center of the tilting deflector 11 is coincident with an object point P3 of the objective lens 14. The trajectory monitoring lens 12 is disposed in the vicinity of the tilting deflector 11 with the optical axis as the central axis thereof. The trajectory correcting deflector 10 is disposed above both the tilting deflector 11 and the trajectory monitoring lens 12. An applied voltage and an excitation current of the trajectory correcting deflector 10 are controlled by a deflector control unit 104 and an applied voltage and an excitation current of the trajectory monitoring lens 12 are controlled by a monitoring lens control unit 105. As characteristics of the present example, the applied voltage and the excitation current of the trajectory monitoring lens 12 become zero when monitoring and correction of the trajectory are not performed.

Next, the correction method of the trajectory will be described. When the primary electron is deflected by a predetermined angle by the aberration controlling deflector 08 and passes through the aberration correcting lens 09, the primary electron does not pass through the point P3 due to the spherical aberration, as described above. In order to correct the change in the trajectory, the primary electron is controlled by the trajectory correcting deflector 10 to pass a point $P_M$ which is the center of a lens field distribution of the trajectory monitoring lens 12 and further, the primary electron is controlled to pass the center of the objective lens 14 using the trajectory correcting deflector 10 and the tilting deflector 11.

Then, when the applied voltage and the excitation current are accumulated in the tilting deflector 11 such that a beam of the primary electron is deflected by the predetermined angle, the primary electron travels through the trajectory 30. Accordingly, correction is performed from the trajectory 32 to the trajectory 30, and the trajectory 30 passes through the point P3.

Next, a method of causing the primary electron to pass through the point $P_M$ which is the center of the trajectory monitoring lens 12 will be described. First, in a state of the trajectory 32, an applied voltage and an excitation current which is controlled by the monitoring lens control unit 105 are applied to the trajectory monitoring lens 12 and are caused to temporally change on a cyclical basis. At this time, since the primary electron does not pass through the point $P_M$ which is the center of the trajectory monitoring lens 12, an off-axis chromatic aberration of the trajectory monitoring lens 12 is generated. This aberration causes a primary electron reaching position on the sample 15 to be changed. Here, since the aberration amount is changed while the applied voltage and the excitation current are changed, an image of the sample 15, which is displayed on the image display unit 112, is shifted with time.

Figure 6:
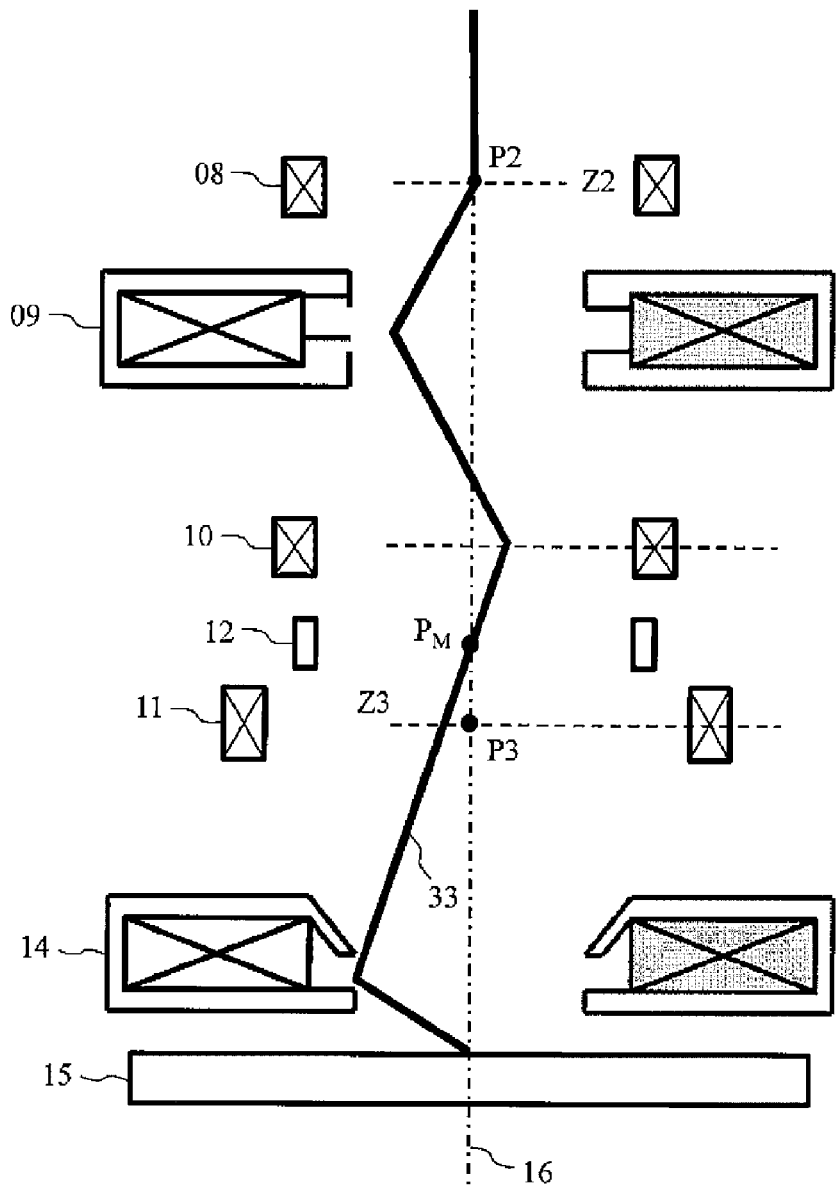
FIG. 6 is a diagram showing a trajectory of a primary electron in a case where an image shift amount becomes zero in S005 in FIG. 5.

Then, the applied voltage and the excitation current are applied to the trajectory correcting deflector 10 which is controlled by the deflector control unit 104, the trajectory of the primary electron is deflected, and a position on the trajectory monitoring lens 12, to which the primary electron is incident, is changed. Here, the applied voltage and the excitation current of the trajectory correcting deflector 10 are adjusted such that a shift amount of the image of the sample 15, which is displayed on the image display unit 112, becomes zero. This adjustment makes it possible for the primary electron to pass through the point $P_M$ (a trajectory 33 in FIG. 6).

Next, a method in which the primary electron is incident to the center of the objective lens 14 will be described. After the adjustment described above, the applied voltage and the excitation current of the trajectory monitoring lens 12 become zero while the applied voltage and the excitation current with which the primary electron passes through the point $P_M$ are set to the trajectory correcting deflector 10. Then, the excitation current of the objective lens 14 is temporally changed on a cyclical basis. Since the primary electron is tilted from the point $P_M$ and is incident, the primary electron passes off-axis through the objective lens 14 and the off-axis chromatic aberration is generated. Accordingly, the image of the sample 15, which is displayed on the image display unit 112, is temporally shifted.

Figure 7:
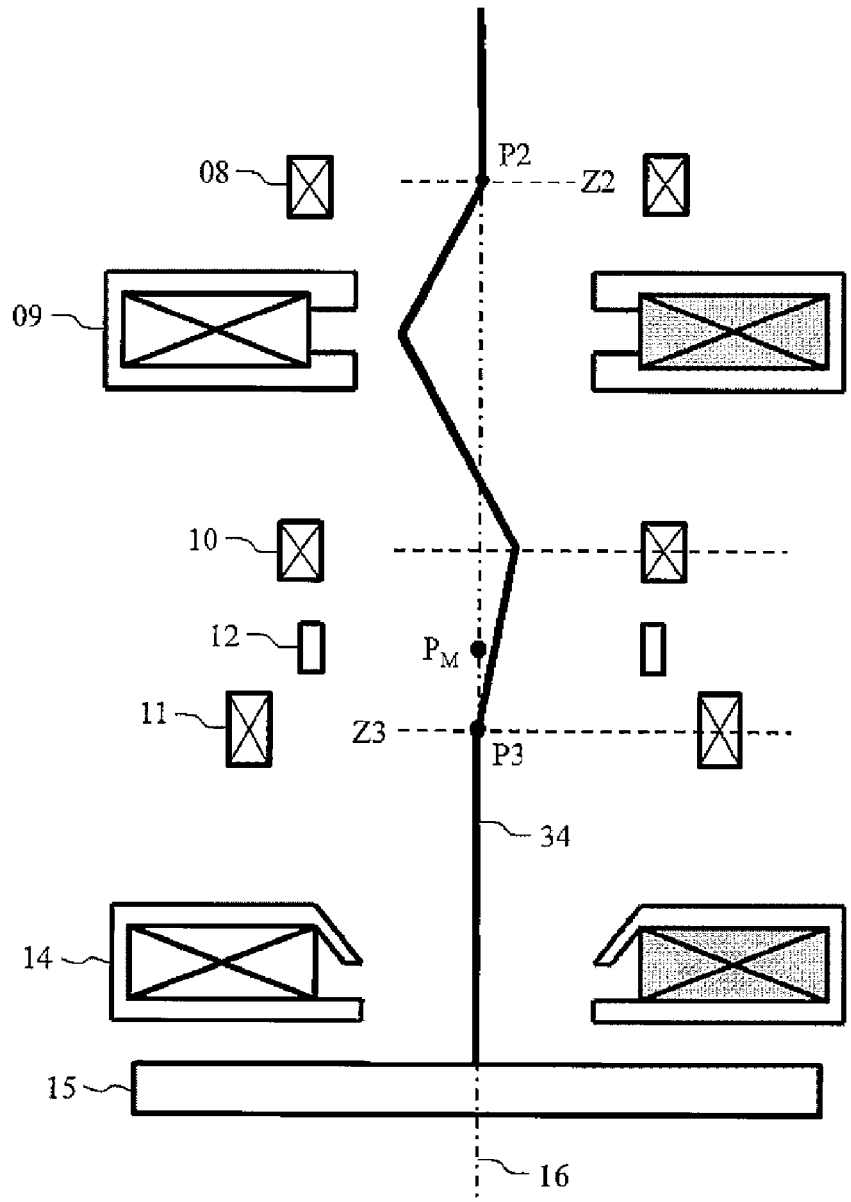
FIG. 7 is a diagram showing a trajectory of the primary electron in a case where the image shift amount becomes zero in S009 in FIG. 5.

Here, the trajectory correcting deflector 10 and the tilting deflector 11 are caused to operate as two-stage deflectors such that a virtual support point of deflection is caused to be coincident with the point $P_M$. Further, the applied voltages and the excitation currents of the trajectory correcting deflector 10 and the tilting deflector 11 are adjusted such that an image shift amount becomes zero. Accordingly, the trajectory of the primary electron that is incident to the center of the objective lens 14 from the central point P3 of the tilting deflector 11 is realized (a trajectory 34 in FIG. 7). Then, when the applied voltage and the excitation current with which the primary electron is deflected by the predetermined angle are accumulated in the tilting deflector 11, the trajectory 32 becomes the trajectory 30 below the point P3.

According to the present example, the change in the trajectory due to the spherical aberration of the aberration correcting lens 09 is corrected and the trajectory which is incident to the objective lens 14 with the object point P3 of the objective lens 14 as the support point of the deflection is realized. Accordingly, a tilt image having small shift in an observation position and high resolution can be obtained.

In addition, the present example is characterized in that the applied voltages and the excitation currents of the respective deflectors are adjusted such that the image shift amount becomes zero during the change in the excitation currents of the trajectory monitoring lens 12 and the objective lens 14 and thereby, the trajectory of the primary electron can be the trajectory formed by connecting two points of the object point P3 of the objective lens 14 and the center of the objective lens 14. According to this configuration, it is possible to remove the change in the trajectory due to the spherical aberration of the aberration correcting lens 09 and it is possible to control the off-axis chromatic aberration, the deflected coma aberration, and the tilt angle with no constraints. As a result, a correction of an essential off-axis chromatic aberration and a deflected coma aberration in a tilt at a significant angle can be realized and the positional shift during a beam tilt can be reduced. In addition, since the trajectory monitoring lens 12 according to the present example operates (turns ON) only when the trajectory of the primary electron is monitored and the applied voltage and the excitation current thereof become zero (that is, turns OFF) when the tilt image is acquired, the lens action and the aberration have no influence on resolution.

In addition, according to the present example, the beam trajectory is monitored and thereby, it is possible to improve reproducibility of the tilt angle or the resolution even in a beam tilt at a small angle.

Example 2

FIG. 2 is a schematic diagram of a configuration of a charged particle beam apparatus according to Example 2 of the present invention. In FIG. 2, the same reference signs are attached to the same components as in FIG. 1 and components other than the components which are described below have the same configurations as in FIG. 1.

In the present example, the tilting deflector 11 and the trajectory monitoring lens 12 are disposed at the same elevation. In addition, the tilting deflector 11 and the trajectory monitoring lens 12 are disposed such that the center of a deflection field distribution of the tilting deflector 11 is disposed at the object point P3 of the objective lens 14 and a center $P_M$ of the lens field distribution of the trajectory monitoring lens 12 is coincident with the object point P3 of the objective lens 14.

When the beam of the primary electron is caused to tilt after the trajectory is corrected using the method of Example 1, the primary electron travels through the trajectory 35. According to Example 1, accuracy of the trajectory correction is determined by the accuracy of the coincidence of the virtual support point of the deflection of the trajectory correcting deflector 10 and the tilting deflector 11 with the lens field center point $P_M$ of the trajectory monitoring lens 12. In the case of the present example, since only the tilting deflector 11 is used when the primary electron is incident to the center of the objective lens 14 from the object point P3 of the objective lens 14, it is possible to correct the trajectory with highest accuracy and it is possible to correct aberration while the positional shift during the beam tilt of the primary electron is prevented.

Example 3

Figure 3:
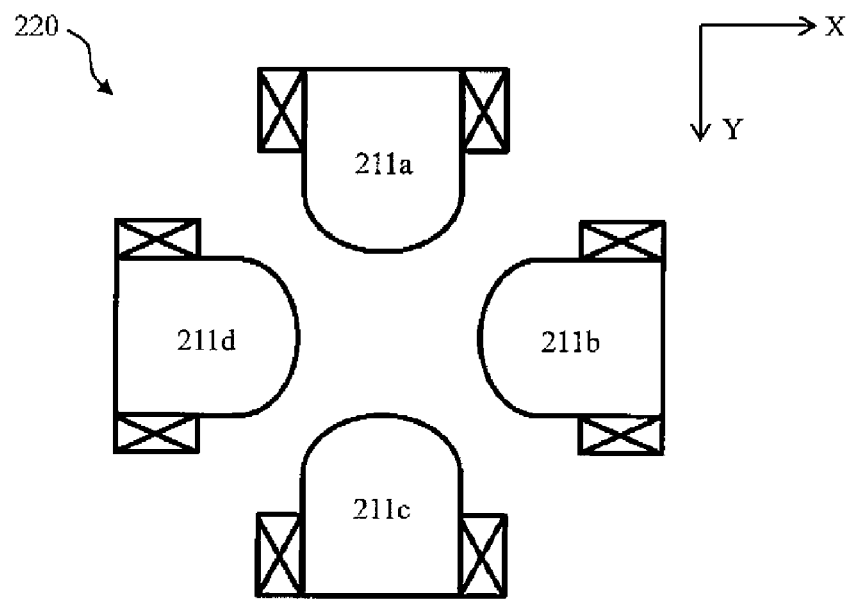
FIG. 3 is a schematic diagram of a configuration of a trajectory monitoring unit according to Example 3.

FIG. 3 is a schematic diagram of a configuration of a trajectory monitoring unit according to Example 3 of the present invention. According to the present example, the most preferred example for realizing the configuration described in Example 2 is described.

According to the present example, the tilting deflector 11 and the trajectory monitoring lens 12 are configured as a deflection unit 220 which is formed to have four magnetic poles. The deflection unit 220 includes four deflectors 211a, 211b, 211c, and 211d. Each of the four deflectors 211a, 211b, 211c, and 211d includes a pole in which a coil is wound.

According to the present example, currents having the same size flow through the coils wound in the poles of the four deflectors 211a, 211b, 211c, and 211d and the currents flows, in a reverse direction, through the coils of the deflectors that face each other. At this time, the deflector 211a and the deflector 211c act as N poles, the deflector 211b and the deflector 211d act as S poles, and the deflection unit 220 acts as a magnetic field-type quadrupole lens. In addition, currents having the same size flow through the coils of the deflectors which face each other, in the same direction. At this time, the deflector 211a acts as the N pole, the deflector 211c acts as the S pole, and the deflection unit 220 acts as a deflector. Accordingly, the deflection unit 220 includes both the quadrupole lens and the deflector. Moreover, since the same magnetic poles and coils are used, a quadrupole field has the same central position as the magnetic field distribution of the deflection field.

In addition, a deflector having no magnetic pole may be used as an alternative example. In this case, a coil is wound by being divided into four blocks which are orthogonal to each other and the same quadrupole lens action is obtained when the currents are applied to the blocks as described above. In this case, in order to suppress an aberration when used as a deflector, it is desirable that the coil is wound in a saddle shape. In addition, instead of the magnetic field-type deflection unit described above, an electric field-type deflection unit which is formed by four electrodes may be used.

The present example is characterized in that, when the direction of the current and polarity of the voltage which are applied to the quadrupoles or the four blocks are changed, it is possible to switch between the quadrupole lens action and the deflection action. Thus, the number of necessary power sources is two and the two power sources that operate the deflectors in an X direction and in a Y direction are sufficient.

Example 4

Figure 4:
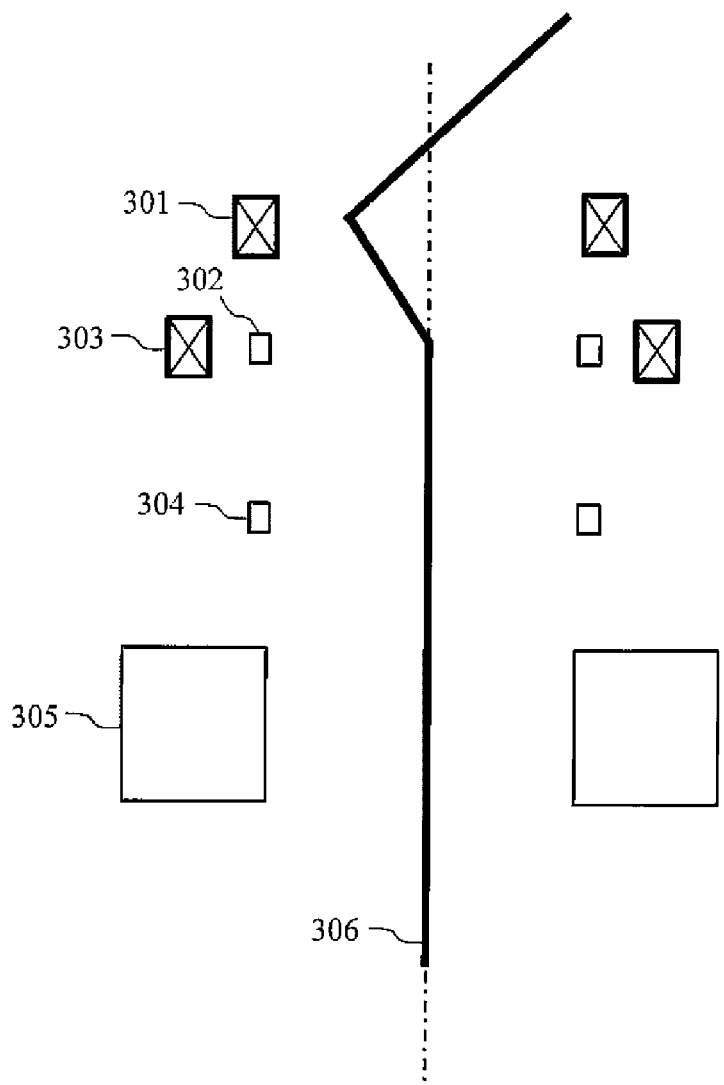
FIG. 4 is a schematic diagram of a configuration of a trajectory monitoring unit according to Example 4.

FIG. 4 is a schematic diagram of a configuration of a trajectory monitoring unit according to Example 4 of the present invention. According to the present example, a case in which the trajectory monitoring unit is applied to a conventional aberration corrector (for example, PTL 3 and PTL 4) is described.

There is a need to perform the adjustment of a corrector again in a case where the trajectory of an electron which is incident to the aberration corrector is changed. Particularly, when a degree of vacuum of an electron gun is lowered, there is a need to perform a baking process of the electron gun and the electron trajectory is inevitably changed before and after the process. In order to simplify an adjustment procedure in such a case, it is possible to apply the present invention.

The aberration corrector 305 corrects an aberration generated in the optical system of the charged particle beam apparatus. Two stages of trajectory monitoring units 302 and 304 are disposed above the aberration corrector 305. Further, two stages of trajectory correcting deflectors 301 and 303 are disposed above the aberration corrector 305. The trajectory correcting deflector 303 on the lower stage side is disposed at the same elevation as the trajectory monitoring unit 302 on the upper stage side so as to have a center in common with the trajectory monitoring unit 302 on the upper stage side. In addition, the trajectory correcting deflector 301 on the upper stage side is disposed above the trajectory correcting deflector 303 on the lower stage side and the trajectory monitoring unit 302 of the upper stage side.

According to the present example, the primary electron 306 is caused to pass through the center of the trajectory monitoring unit 302 on the upper stage side using the trajectory correcting deflector 301 on the upper stage side, following the procedure described in Example 1 and further is caused to pass through the center of the trajectory monitoring unit 304 on the lower stage side using the trajectory correcting deflector 303 on the lower stage side. Accordingly, the primary electron travels through a trajectory 306. As a result, the primary electron is incident to the aberration corrector 305 through the trajectory formed by connecting two points of the centers of the trajectory monitoring lens 302 on the upper stage side and the trajectory monitoring lens 304 on the lower stage side.

According to the present example, even when the trajectory of the primary electron which is incident to the trajectory correcting deflector 301 on the upper stage side is changed, it is possible to correct the trajectory which is incident to the aberration corrector 305. Thus, when the aberration corrector 305 is adjusted once, the trajectory correction operation only has to be performed with respect to the change in the incident trajectory and there is no need to perform adjustment of the aberration corrector 305 again. Therefore, it is possible to simplify the adjustment procedure performed in a case where the electron trajectory incident to the aberration corrector is changed. In addition, it is needless to say that the two stages of the trajectory monitoring units 302 and 304 and the two stages of the trajectory correcting deflectors 301 and 303 described in the present example are disposed on any optical element and thereby it is possible to correct the incident trajectory.

<Flow of Trajectory Correcting Process According to Example 1>

Figure 5:
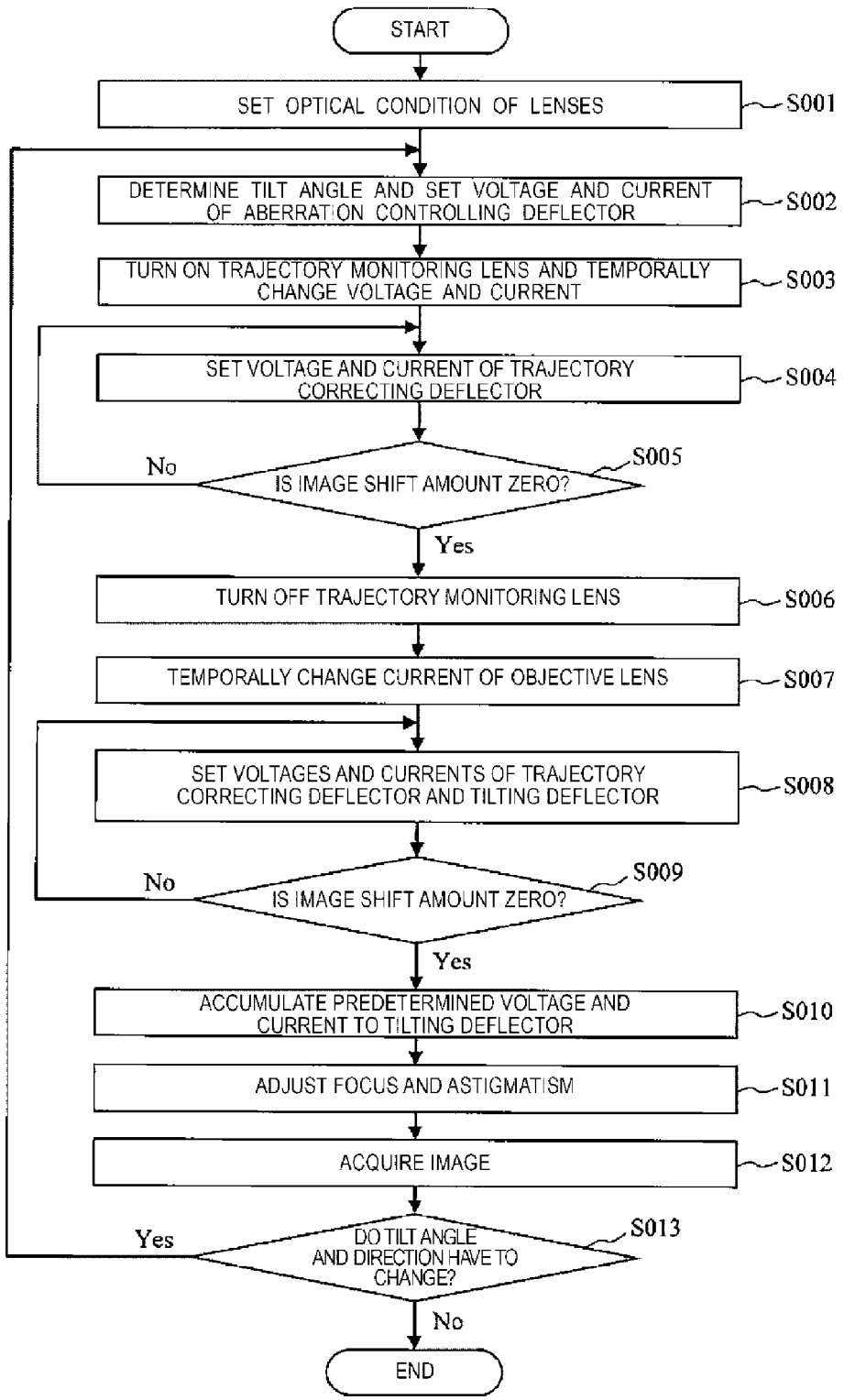
FIG. 5 is a flowchart of a trajectory correction according to Example 1.

Next, flow of the trajectory correction according to Example 1 is described. FIG. 5 is a flowchart of the trajectory correction according to Example 1.

First, in step S001, a predetermined current and voltage is applied to the condenser lens 04, the condenser lens 06, the aberration correcting lens 09, and the objective lens 14 and optical conditions are set. At this time, the respective lenses are controlled by the lens condition setting unit 202 of the optical system control unit 111.

Next, in step S002, the tilt angle of the beam of the primary electron is determined and an aberration for correction is generated. Thus, the applied voltage and the excitation current of the aberration controlling deflector 08 are set, the beam of the primary electron is deflected by the predetermined angle, and the deflected beam is caused to pass through the aberration correcting lens 09. The aberration controlling deflector 08 is controlled by the deflector condition setting unit 203 of the optical system control unit 111.

Next, in step S003, the current and voltage are applied to the trajectory monitoring lens 12 and the applied voltage and the excitation current of the trajectory monitoring lens 12 are temporally changed (first control mode). At this time, the lens condition setting unit 202 of the optical system control unit 111 controls the trajectory monitoring lens 12 through the monitoring lens control unit 105.

Next, in step S004, the applied voltage and the excitation current of the trajectory correcting deflector 10 are set and the trajectory of the primary electron is deflected. At this time, the deflector condition setting unit 203 of the optical system control unit 111 controls the trajectory correcting deflector 10 through the deflector control unit 104.

Next, in step S005, it is determined whether the image shift amount of the image of the sample 15 is zero. If the image shift amount is not zero, the process returns to step S004 and the applied voltage and the excitation current of the trajectory correcting deflector 10 are changed. In the case where the image shift amount is zero, the applied voltage and the excitation current of the trajectory correcting deflector 10, with which the image shift amount becomes zero, are set and the primary electron is caused to pass through the point $P_M$. At this time, the primary electron travels through the trajectory 33 in FIG. 6. The optical system control unit 111 causes the applied voltage and the excitation current of the trajectory correcting deflector 10, with which the image shift amount becomes zero, to be recorded in the deflector-operation condition recording unit 113.

Next, the setting of the applied voltage and the excitation current of the trajectory correcting deflector 10 in step S004 and the determination of whether the image shift amount is zero in step S005 may be performed by an operator or may be automatically performed by the optical system control unit 111. For example, the voltage/current control unit 116 of the optical system control unit 111 automatically calculates the image shift amount and the applied voltage and the excitation current of the trajectory correcting deflector 10 are changed such that the image shift amount becomes zero. For example, a technology disclosed in PTL 5 is applied to the voltage/current control unit 116 and thereby, it is possible to perform a process in which the applied voltage and the excitation current of the trajectory correcting deflector 10 are automatically changed such that the image shift amount becomes zero.

Next, in step S006, the applied voltage and the excitation current of the trajectory monitoring lens 12 becomes zero. Next, in step S007, the excitation current flowing through the objective lens 14 is temporally changed (second control mode). These processes are controlled by the lens condition setting unit 202 of the optical system control unit 111.

Next, in step S008, the trajectory correcting deflector 10 and the tilting deflector 11 which are controlled by the deflector control units 104 and 106 are caused to operate as the two-stage deflectors and the applied voltages and the excitation currents of the trajectory correcting deflector 10 and the tilting deflector 11 are set with the virtual support point of the deflection as the point $P_M$. At this time, the applied voltage and the excitation current which are adjusted in step S005 are accumulated in the trajectory correcting deflector 10.

Next, in step S009, it is determined whether the image shift amount of the image of the sample 15 is zero. If the image shift amount is not zero, the process returns to step S008 and the applied voltages and the excitation currents of the trajectory correcting deflector 10 and the tilting deflector 11 are changed. In the case where the image shift amount is zero, the optical system control unit 111 causes the applied voltages and the excitation currents of the trajectory correcting deflector 10 and the tilting deflector 11, with which the image shift amount becomes zero, to be recorded in the deflector-operation condition recording unit 113. At this time, the primary electron travels through the trajectory 34 in FIG. 7 and is incident to the center of the objective lens 14 from the point P3.

Next, the setting of the applied voltages and the excitation currents of the trajectory correcting deflector 10 and the tilting deflector 11 in step S008 and the determination of whether the image shift amount is zero in step S009 may be performed by an operator or may be automatically performed by the optical system control unit 111. For example, the voltage/current control unit 116 of the optical system control unit 111 automatically calculates the image shift amount and the applied voltages and the excitation currents of the trajectory correcting deflector 10 and the tilting deflector 11 are changed such that the image shift amount becomes zero. As described above, a technology disclosed in PTL 5 is applied to the voltage/current control unit 116 and thereby, it is possible to perform a process in which the applied voltages and the excitation currents of the trajectory correcting deflector 10 and the tilting deflector 11 are automatically changed such that the image shift amount becomes zero.

Next, in step S010, the applied voltage and the excitation current which are used for deflecting the primary electron by the predetermined angle are accumulated to the tilting deflector 11 in addition to the aberration corrector and the excitation current for trajectory correction, which are obtained in step S009, and the primary electron is tilted.

Next, in step S011, field curvature and astigmatism which are generated in step S010 are corrected by adjusting the excitation current flowing through the objective lens 14 and a stigmator 07. The excitation current of the stigmator 07 is controlled by a stigmator control unit 108. The optical system control unit 111 causes the respective adjustment amounts to be recorded in the lens-operation condition recording unit 114.

Next, in step S012, the charged particle beam apparatus acquires a tilt image under imaging conditions set in the process to step S011. Then, in step S013, it is determined whether or not the change in the tilt angle and the tilt direction is performed. In the case of the change, the process returns to step S002. In a case where the process returns to step S002, an applied voltage and an excitation current of the aberration controlling deflector 08 are newly set. It is possible to acquire the tilt image through the above flow after the trajectory correction.

In the case of Example 2, it is possible to perform the trajectory correction through the same flow. In this case, in step S008 and step S009 in FIG. 5, the primary electron may be deflected using only the tilting deflector 11 and the applied voltage and the excitation current may be adjusted such that the image shift amount becomes zero.

The applied voltages and the excitation currents recorded in the deflector-operation condition recording unit 113 and the lens-operation condition recording unit 114 in the optical system control unit 111 may be organized in a table. For example, information of the applied voltage and the excitation current recorded in the deflector-operation condition recording unit 113 and the lens-operation condition recording unit 114 may be recorded in a predetermined storage unit for each of the optical condition, the tilt angle, and the tilt direction of a lens, in a table structure. It is possible to simplify the adjustment during tilting of the primary electron beam by using the information in the table structure.

In addition, in PTL 1, when applied voltages and excitation currents of an aberration correcting lens and an objective lens are synchronized and are temporally changed, applied voltages and excitation currents of an aberration controlling deflector and a tilting deflector are adjusted such that the image shift amount becomes zero and a condition in which an off-axis chromatic aberration during a tilt becomes zero is automatically adjusted. It is possible to automatically adjust a condition in which the off-axis chromatic aberration during the trajectory correction and the tilt becomes zero using this method or combining this method with a method in which an acceleration voltage is changed instead of the applied voltage and the excitation current of the lens.

In addition, the applied voltage and the excitation current recorded in the deflector-operation condition recording unit 113 and the lens-operation condition recording unit 114 may be delivered to the trajectory calculating unit 115 and trajectory calculation may be performed. The trajectory calculating unit 115 computes an off-axis amount from the optical axis 16 and an incident angle which are obtained when the primary electron passes through the center of the trajectory correcting deflector 10, for each lens condition. For example, permissible amounts of the off-axis amount and the incident angle which satisfy performance of the apparatus are set in advance. In a case where a value calculated by the trajectory calculating unit 115 is beyond the permissible amount thereof, it is possible to set an optical condition of the lens or the applied voltage and the excitation current of the aberration controlling deflector 08 and it is possible to determine abnormal adjustment of the optical axis of the lens.

<Flow of Trajectory Correcting Process According to Example 4>

Figure 8:
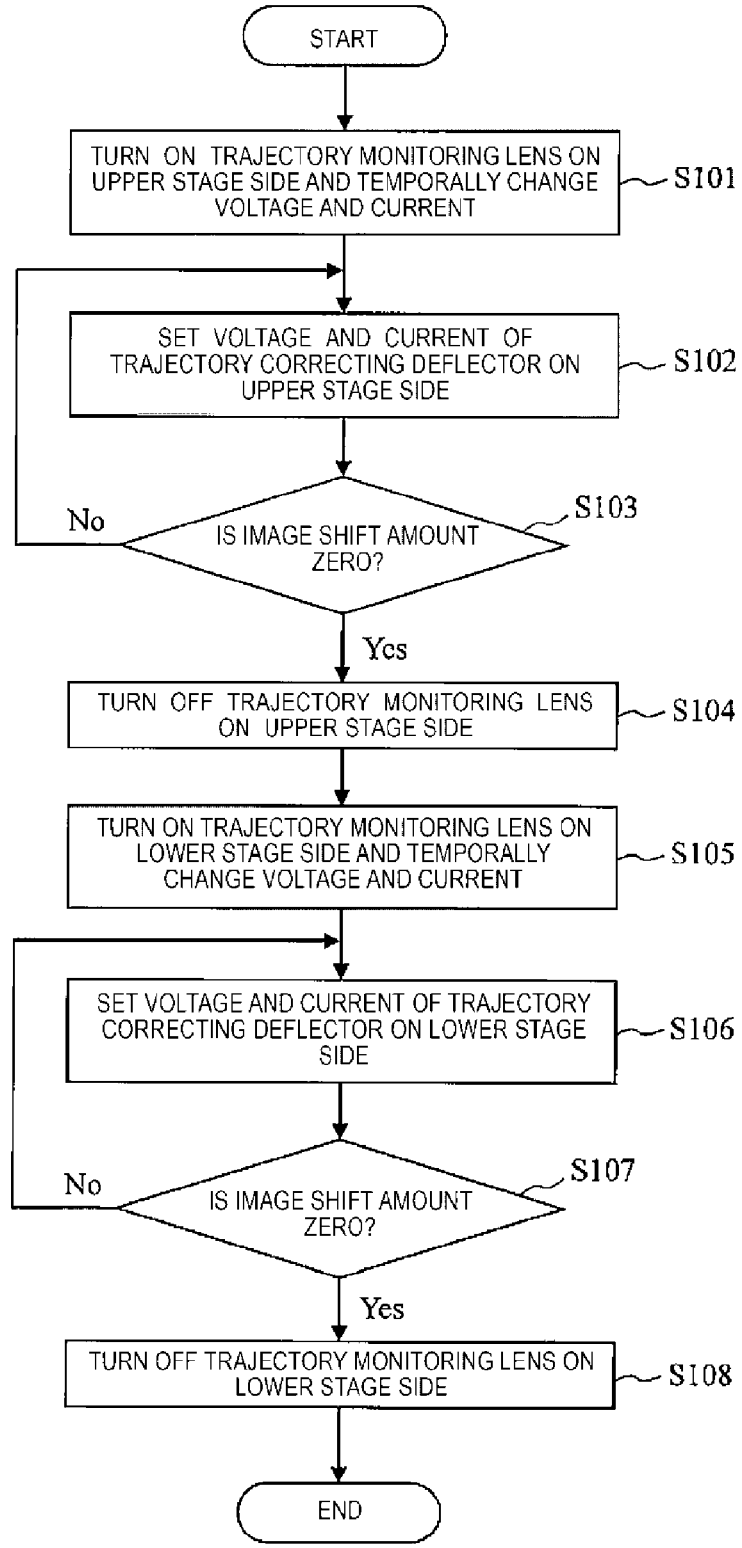
FIG. 8 is a flowchart of a trajectory correction according to Example 4.

Next, flow of a trajectory correction in Example 4 will be described. FIG. 8 is a flowchart of the trajectory correction according to Example 4.

First, the aberration corrector 305 finishes the adjustment of the primary electron which is perpendicularly incident along the optical axis. In a case where an incident trajectory of the primary electron is changed due to a baking process or the like, an applied voltage and an excitation current are set to the trajectory monitoring unit 302 on the upper stage side and the applied voltage and the excitation current are temporally changed in step S101 (a third control method).

Next, in step S102, the applied voltage and the excitation current of the trajectory correcting deflector 301 on the upper stage side are set and the primary electron is deflected.

Next, in step S103, it is determined whether the image shift amount of the image of the sample 15 is zero. If the image shift amount is zero, the process returns to step S102 and the applied voltage and the excitation current of the trajectory correcting deflector 301 on the upper stage side are changed. In the case where the image shift amount is zero, the process proceeds to step S104.

Next, in step S104, the applied voltage and the excitation current of the trajectory monitoring unit 302 on the upper stage side becomes zero. Next, in step S105, the applied voltage and the excitation current of the trajectory monitoring unit 304 on the lower stage side are set and the applied voltage and the excitation current are temporally changed (fourth control mode).

Next, in step S106, the applied voltage and the excitation current of the trajectory correcting deflector 303 on the lower stage side are set. Next, in step S107, it is determined whether the image shift amount of the image of the sample 15 is zero. If the image shift amount is zero, the process returns to step S106 and the applied voltage and the excitation current of the trajectory correcting deflector 303 on the lower stage side are changed. In the case where the image shift amount is zero, the process proceeds to step S108.

Finally, in step S108, if the applied voltage and the excitation current of the trajectory monitoring unit 304 on the lower stage side is zero, the trajectory correction according to Example 4 is ended. The trajectory of the primary electron after the trajectory correction becomes the trajectory 306 shown in FIG. 4. That is, the primary electron is incident to the aberration corrector 305 through a trajectory formed by connecting the two points of the center of the trajectory monitoring unit 302 on the upper stage side and the center of the trajectory monitoring unit 304 on the lower stage side.

Similar to the case of Example 1, it is possible to automatically perform the trajectory correction also in the cases of Example 2 to Example 4. In addition, it is needless to say that it is possible to compute an off-axis amount from the optical axis and an incident angle of a trajectory which is incident to a trajectory correcting deflector.

In addition, the processes of steps S102, S103, S106, and S107 in FIG. 8 may be automatically performed. For example, the voltage/current control unit 116 adjusts the applied voltage and the excitation current of the trajectory correcting deflector 301 on the upper stage side such that the image shift amount of the sample image becomes zero in the third control mode and adjusts the applied voltage and the excitation current of the trajectory correcting deflector 303 on the lower stage side such that the image shift amount of the sample image becomes zero in the fourth control mode.

The present invention is not limited to the examples described above and includes various modification examples. For example, the examples described above are described in detail in order to provide an easy description of the present invention and the present invention is not limited to the example which includes the entire configuration described above. In addition, a part of a configuration of a certain example can be replaced with a configuration of another example and further it is possible to add a configuration of a certain example to a configuration of another example. In addition, in a part of the configuration of the respective examples, addition, removal, and replacement of another configuration can be performed.

In addition, control-process lines and information-process lines in the drawings are illustrated as necessary for the description and the control-process lines and information-process lines on the product are not all illustrated. All of the configurations may be connected to each other.

REFERENCE SIGNS LIST 01 cathode
02 first anode
03 second anode
04 condenser lens
05 movable objective aperture
06 condenser lens
07 stigmator
08 aberration controlling deflector
09 aberration correcting lens
10 trajectory correcting deflector
11 tilting deflector
12 trajectory monitoring lens
13 scanning deflector
14 objective lens
15 sample
16 optical axis
30 trajectory
31 trajectory
32 trajectory
33 trajectory
34 trajectory
35 trajectory
40 crossed electric and magnetic field generating device (EXB)
41 reflector
42 detector 100 high-voltage control unit
101 condenser lens control unit
102 deflector control unit
103 aberration correcting lens control unit
104 deflector control unit
105 monitoring lens control unit
106 deflector control unit
107 deflector control unit
108 stigmator control unit
109 objective lens control unit
110 stage control unit
111 optical system control unit
112 image display unit
113 deflector operation recording unit
114 lens operation recording unit
115 trajectory calculating unit
116 voltage/current control unit
201 high-voltage condition setting unit
202 lens condition setting unit
203 deflector condition setting unit
211a deflector
211b deflector
211c deflector
211d deflector
220 deflection unit
301 trajectory correcting deflector on the upper stage side
302 trajectory monitoring lens on the upper stage side
303 trajectory correcting deflector on the lower stage side
304 trajectory monitoring lens on the lower stage side
305 aberration corrector
306 trajectory

The invention claimed is:

1. A charged particle beam apparatus comprising:
a charged particle source for supplying a primary charged particle beam;
a condenser lens for controlling a focusing angle and a focusing position of the primary charged particle beam;
an objective lens for focusing the primary charged particle beam on a sample;
a scanning device that scans the sample with the primary charged particle beam;
a detector that detects charged particles which are generated from the sample;
an image processing device that forms a sample image based on a signal from the detector; and
a trajectory monitoring unit that is disposed above the objective lens and includes an optical element having a lens action and a trajectory correcting deflector,
wherein an applied voltage and an excitation current of the optical element are set to zero after a trajectory correction of the primary charged particle beam.

2. The charged particle beam apparatus according to claim 1,
wherein one optical element having the lens action is provided and the trajectory correcting deflector is configured to include two deflectors,
wherein one deflector of the two deflectors and the optical element are disposed at the same elevation and are disposed such that the center of the one deflector is coincident with the center of the optical element, and
wherein the other deflector of the two deflectors is disposed above the one deflector and the optical element.

3. The charged particle beam apparatus according to claim 2,
wherein the optical element includes magnetic-field type or electric-field type quadrupoles and has a trajectory correcting function of the one deflector.

4. The charged particle beam apparatus according to claim 1,
wherein the applied voltage and the excitation current of the optical element are set to zero after the trajectory correcting deflector corrects the primary charged particle beam to a trajectory which passes through the center of the optical element.

5. The charged particle beam apparatus according to claim 1, further comprising:
an aberration correcting lens for correcting an aberration of the objective lens during a tilt of the primary charged particle beam; and
a deflector for causing the primary charged particle beam to pass off-axis through the aberration correcting lens,
wherein the optical element is disposed such that the center of the optical element is coincident with an object point of the objective lens, and
wherein the trajectory monitoring unit corrects a change of a trajectory due to a spherical aberration of the aberration correcting lens.

6. The charged particle beam apparatus according to claim 5,
wherein the trajectory monitoring unit corrects the trajectory of the primary charged particle beam to a trajectory connecting two points of the object point of the objective lens and the center of the objective lens.

7. The charged particle beam apparatus according to claim 1, further comprising:
a control unit that includes a first control mode in which each of the applied voltage and the excitation current of the optical element is caused to temporally change and a second control mode in which an excitation current of the objective lens is caused to temporally change; and
a voltage/current control unit that adjusts an applied voltage and an excitation current of the trajectory correcting deflector such that an image shift amount of the sample image becomes zero in the first control mode and the second control mode.

8. The charged particle beam apparatus according to claim 7, further comprising:
a recording unit that records the applied voltage and the excitation current which are adjusted by the voltage/current control unit; and
a trajectory calculating unit that calculates a trajectory of the primary charged particle beam using the applied voltage and the excitation current of the trajectory correcting deflector, which are recorded in the recording unit.

9. The charged particle beam apparatus according to claim 1, further comprising:
an aberration corrector for correcting an aberration of an optical system of the charged particle beam apparatus,
wherein the trajectory monitoring unit is disposed above the aberration corrector,
wherein the optical element is configured to include an upper optical element and a lower optical element,
wherein the trajectory correcting deflector is configured to include an upper deflector and a lower deflector, and
wherein the lower optical element and the upper deflector are disposed at the same elevation and are disposed such that the center of the lower optical element is coincident with the center of the upper deflector.

10. The charged particle beam apparatus according to claim 9,
wherein an applied voltage and an excitation current of the upper optical element become zero after the trajectory correction of the primary charged particle beam.

11. The charged particle beam apparatus according to claim 9,
wherein the trajectory monitoring unit performs a correction to a trajectory obtained by connecting two points of the center of the upper optical element and the center of the lower optical element.

12. The charged particle beam apparatus according to claim 9, further comprising:
a control unit that includes a third control mode in which each of the applied voltage and the excitation current of the upper optical element is caused to temporally change and a fourth control mode in which each of the applied voltage and the excitation current of the lower optical element is caused to temporally change; and
a voltage/current control unit that adjusts an applied voltage and an excitation current of the upper deflector such that an image shift amount of the sample image becomes zero in the third control mode and adjusts an applied voltage and an excitation current of the lower deflector such that an image shift amount of the sample image becomes zero in the fourth control mode.

13. A trajectory correction method of a charged particle beam apparatus that includes
a charged particle source for supplying a primary charged particle beam,
a condenser lens for controlling a focusing angle and a focusing position of the primary charged particle beam,
an objective lens for focusing the primary charged particle beam on a sample,
a scanning device that scans the sample with the primary charged particle beam,
a detector that detects charged particles which are generated from the sample,
an image processing device that forms a sample image based on a signal from the detector, and
a trajectory monitoring unit that is disposed above the objective lens and includes an optical element having a lens action and a trajectory correcting deflector,
the method comprising:
adjusting an applied voltage and an excitation current of the trajectory correcting deflector such that an image shift amount of the sample image becomes zero in a first control mode in which each of the applied voltage and the excitation current of the optical element is caused to temporally change;
setting the applied voltage and the excitation current of the optical element to zero; and
adjusting an applied voltage and an excitation current of the trajectory correcting deflector such that an image shift amount of the sample image becomes zero in a second control mode in which an excitation current of the objective lens is caused to temporally change.

* * * * *